US009494065B2

(12) United States Patent
Lee et al.

(10) Patent No.: US 9,494,065 B2
(45) Date of Patent: Nov. 15, 2016

(54) APPARATUS FOR PROCESSING EXHAUST FLUID

(75) Inventors: Sang-Yun Lee, Seoul (KR); Myung Keun Noh, Gyeonggi-do (KR); Heaungshig Oh, Gyeonggi-do (KR)

(73) Assignee: LOT VACUUM CO., LTD., Anseong-Si (KR)

( * ) Notice: Subject to any disclaimer, the term of this patent is extended or adjusted under 35 U.S.C. 154(b) by 408 days.

(21) Appl. No.: 13/976,328

(22) PCT Filed: Dec. 27, 2011

(86) PCT No.: PCT/KR2011/010150
§ 371 (c)(1),
(2), (4) Date: Sep. 11, 2013

(87) PCT Pub. No.: WO2012/091406
PCT Pub. Date: Jul. 5, 2012

(65) Prior Publication Data
US 2014/0004009 A1 Jan. 2, 2014

(30) Foreign Application Priority Data
Dec. 27, 2010 (KR) ........................ 10-2010-0135260

(51) Int. Cl.
*F01N 3/08* (2006.01)
*B01D 53/32* (2006.01)
(Continued)

(52) U.S. Cl.
CPC ............. *F01N 3/0892* (2013.01); *B01D 53/32* (2013.01); *H01L 21/67017* (2013.01);
(Continued)

(58) Field of Classification Search
CPC ................ B01D 53/32; B01D 53/323; B01D 2258/0216; F01N 3/0892; H01L 21/67017; H05H 1/2406; H05H 1/2456; H05H 1/2462
USPC .......... 422/119, 168, 173, 174, 186, 186.04; 204/164
See application file for complete search history.

(56) References Cited

U.S. PATENT DOCUMENTS 6,685,803 B2 * 2/2004 Lazarovich et al. .......... 204/164
7,108,836 B2 * 9/2006 Okihara et al. ............ 422/186.2
(Continued)

FOREIGN PATENT DOCUMENTS

CN 1427035 A 7/2003
CN 101108298 A 1/2008
(Continued)

OTHER PUBLICATIONS

Translation of International Search Report for PCT/KR2011/010150 dated Jun. 28, 2012.
(Continued)

*Primary Examiner* — Jill Warden
*Assistant Examiner* — Joye L Woodard
(74) *Attorney, Agent, or Firm* — Jonathan A. Kidney; TechLaw LLP (57) ABSTRACT

Provided is an apparatus for processing exhaust fluid in which a fluid generated in a process chamber of an apparatus for manufacturing a semiconductor, a display panel, or a solar cell is ejected to the outside. The apparatus for processing exhaust fluid includes: a vacuum pump that is connected to the process chamber, vacuumizes the inside of the process chamber, and ejects the fluid generated in the process chamber to the outside; and a plasma reactor in which plasma is formed and the fluid generated in the process chamber decomposes, wherein the plasma reactor includes: an insulating conduit that is provided between the process chamber and the vacuum pump and provides a space in which the fluid decomposes; at least one electrode unit that is provided on the outer circumferential surface of the conduit and receives a voltage to form the plasma; a buffer unit that is formed of an electrically conductive elastic substance and is disposed between the conduit and the electrode unit to attach the conduit and the electrode unit closely together; and an external pipe into which the conduit, electrode unit and buffer unit are inserted with sealing flanges provided on both end portions of the conduit and external pipe to seal a space between the conduit and the external pipe to prevent fluid process by-products from leaking out should the conduit crack or is damaged.

8 Claims, 5 Drawing Sheets

(51) Int. Cl.
*H01L 21/67* (2006.01)
*H05H 1/24* (2006.01)

(52) U.S. Cl.
CPC ... *H05H 1/2406* (2013.01); *B01D 2257/2025* (2013.01); *B01D 2257/2027* (2013.01); *B01D 2257/2047* (2013.01); *B01D 2258/0216* (2013.01); *B01D 2259/818* (2013.01); *H05H 2001/2456* (2013.01); *H05H 2245/1215* (2013.01)

(56) References Cited

U.S. PATENT DOCUMENTS

| | | |
|---|---|---|
| 2003/0116541 A1 | 6/2003 | Chiou |
| 2003/0144381 A1 | 7/2003 | Mizuta et al. |
| 2004/0229419 A1 | 11/2004 | Namose |

FOREIGN PATENT DOCUMENTS

| | | |
|---|---|---|
| DE | 10 2008 041657 A1 | 3/2010 |
| JP | 06-178914 | 6/1994 |
| JP | H0226804 A | 1/1999 |
| JP | 2004-223365 | 12/2004 |
| JP | 2005-240634 A | 9/2005 |
| JP | 2006-029212 A | 2/2006 |
| JP | 2006-097486 A | 4/2006 |
| JP | 2006-175422 | 7/2006 |
| JP | 2007-044628 | 2/2007 |
| JP | 2007044628 A | 2/2007 |
| KR | 10-2006-0095594 | 9/2006 |
| KR | 10-2010-0027383 | 3/2010 |

OTHER PUBLICATIONS

Written Opinion for PCT/KR2011/010150 dated Jun. 28, 2012.

* cited by examiner

APPARATUS FOR PROCESSING EXHAUST FLUID

CROSS-REFERENCE TO RELATED APPLICATION(S)

This is a national stage application under 35 USC 371 of International Application No. PCT/KR2011/010150, which claims priority to and the benefit of Korean Patent Application No. 2010-0135260, filed on Dec. 27, 2010, the disclosures of which are incorporated herein by reference in their entirety.

BACKGROUND

1. Field of the Invention

The present invention relates to an apparatus for processing exhaust fluid, and more particularly, to an apparatus for processing exhaust fluid using plasma for removing process by-products such as non-reactive or waste gases generated in a process chamber in the manufacturing process of a semiconductor, a display panel, or a solar cell.

2. Discussion of Related Art

In the manufacturing process of a semiconductor, a display panel, or a solar cell, processes such as ashing, etching, deposition, cleaning, and nitriding are performed in a low-pressure process chamber.

Examples of gases used in the manufacturing process may include 1) a volatile organic compound (e.g., trichloroethylene, 1,1,1-trichloroethane, methanol, or acetaldehyde), 2) acid-based gas, 3) odor-causing material, 4) autoignition gas, and 5) material which causes global warming (e.g., a perfluoro compound), and process by-products such as non-reactive and waste gases which are generated through the manufacturing process.

Since hydrogen fluoride (HF), fluoride, chloride, etc. among the non-reactive and waste gases generated in the manufacturing process corrode metal surfaces while moving in a vacuum pump and a pipe and most of the gases used in the manufacturing process are environmental contaminants, the HF, fluoride, chloride, and gases have to be removed before finally being discharged.

Fine particles and metals generated in the manufacturing processes pass through parts provided in various passages through which a fluid moves such as a connection pipe to be phase-changed into a powder due to cooling or a change in pressure. Such powders are the main cause of the reduced lifespan of the vacuum pump. Also, discharge of the perfluoro compounds into the air is becoming increasingly restricted due to environmental regulations.

Accordingly, existing technology removes the process by-products generated in the low-pressure process chamber by providing a mechanism such as a trap in front of or behind the vacuum pump and performing heating or cooling functions.

Also, since they are disposed behind the vacuum pump and operate in the air using a room pressure plasma method, some plasma processing mechanisms which are currently used have problems because a large amount of energy is used and equipment costs are high. Furthermore, the plasma processing mechanisms have problems since the process by-products accumulate and the vacuum pump has to stop operating when the process by-products generated in the process chamber are introduced into the vacuum chamber.

Meanwhile, a plasma reactor provided in front of the vacuum pump may efficiently decompose the process by-products to prevent energy waste. In particular, the plasma reactor may control the sizes of particles such as the process by-products. Also, when the process by-products are process by-products which are solid in form, the plasma reactor may further improve the mobility of the solid process by-products introduced into the vacuum pump to reduce the accumulation amount in the vacuum pump, thereby extending the lifespan of the vacuum pump.

As such, the plasma reactor that is provided in front of the vacuum pump and generates low-pressure plasma generally uses an inductively coupled plasma method or a radio frequency (RF) driving method.

The plasma reactor using the inductively coupled plasma method that generates plasma by applying voltages to both end portions of an electrode shaped like a coil has a problem in that cost of the equipment is high. The plasma reactor using the RF driving method has a problem in that installation and maintenance costs are high since an RF power supply is very expensive and much power is used for maintenance of plasma.

SUMMARY OF THE INVENTION

The present invention is an apparatus for processing exhaust fluid that may reduce installation and maintenance costs, improve efficiency in processing process by-products, and stably operate for a long time by including a plasma reactor that is provided in front of the vacuum pump and generates low-pressure plasma.

According to an aspect of the present invention, an apparatus for processing exhaust fluid is provided that ejects to the outside a fluid generated in a process chamber of an apparatus for manufacturing a semiconductor, a display panel, or a solar cell. The apparatus for processing exhaust fluid includes: a vacuum pump that is connected to the process chamber, vacuumizes the inside of the process chamber, and ejects the fluid generated in the process chamber to the outside; and a plasma reactor in which plasma is formed and the fluid generated in the process chamber decomposes, wherein the plasma reactor includes: an insulating conduit that is provided between the process chamber and the vacuum pump and provides a space in which the fluid decomposes; at least one electrode unit that is provided on an outer circumferential surface of the conduit and receives voltage to form the plasma; and a buffer unit that is formed of an electrically conductive elastic substance and is disposed between the conduit and the electrode unit to attach the conduit and the electrode unit closely together.

BRIEF DESCRIPTION OF THE DRAWINGS

The descriptions mentioned above and other objects, features, and advantages of the present invention will become more apparent to those of ordinary skill in the art since exemplary embodiments thereof with reference to the accompanying drawings are described in detail, in which.

DETAILED DESCRIPTION OF EXEMPLARY EMBODIMENTS

Exemplary embodiments of the present invention will be described in detail below with reference to the accompanying drawings. The drawings, sizes or shapes of the elements may be exaggerated for clarity and convenience. Also, the terms are specially defined considering that the structure and the operation of the present invention may vary according to the intention of a user or an operator or customary practice. The terms should be defined based on the meaning of the content throughout the specification of the present invention.

While the spirit of the present invention will be particularly shown and described with reference to the exemplary embodiments thereof, it will be understood by those of ordinary skill in the art that various changes in form and details may be made therein without departing from the scope of the invention.

Figure 1:
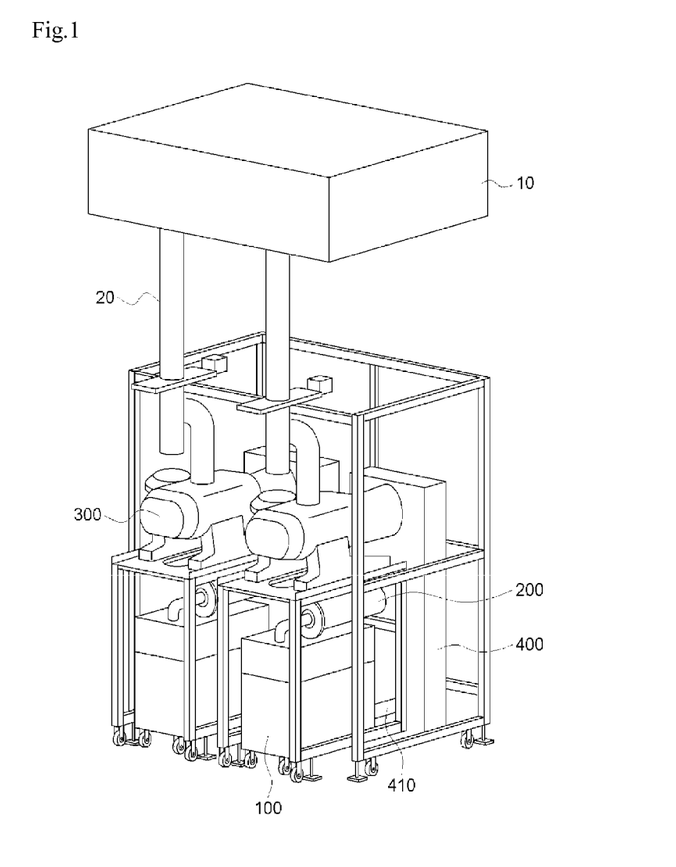
FIG. 1 is a perspective view illustrating an apparatus for processing exhaust fluid according to an embodiment of the present invention.
Figure 2:
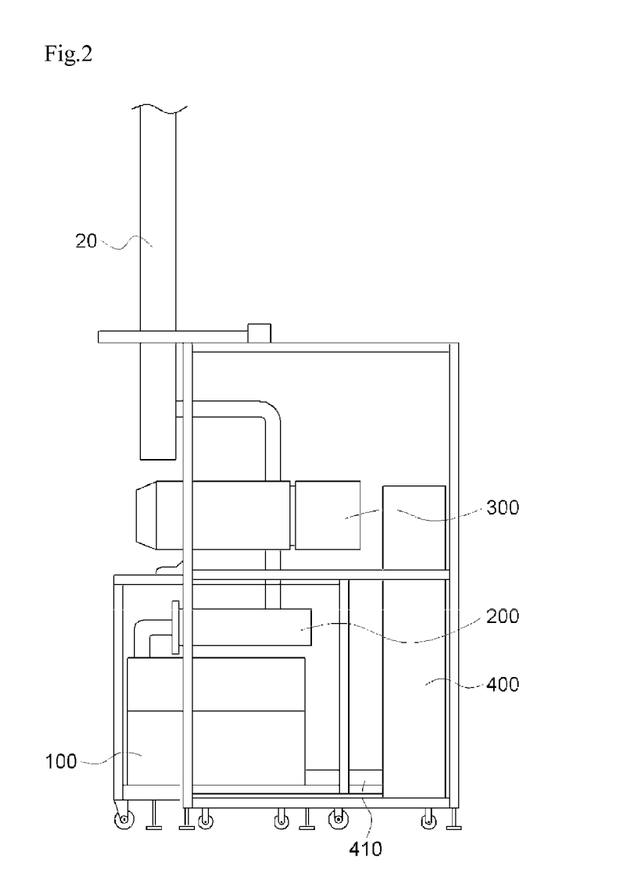
FIG. 2 is a side view illustrating the apparatus for processing exhaust fluid of FIG. 1.

FIG. 1 is a perspective view illustrating an apparatus for processing exhaust fluid according to an embodiment of the present invention. FIG. 2 is a side view illustrating the apparatus for processing exhaust fluid of FIG. 1. The detailed structure and the state of operation of the apparatus for processing exhaust fluid will be explained in detail with reference to FIGS. 1 and 2.

Referring to FIGS. 1 and 2, the apparatus for processing exhaust fluid is connected by a connection pipe 20 to a low-pressure process chamber 10 in which processes such as ashing, etching, deposition, or nitriding within the process of manufacturing a semiconductor, a display panel, or a solar cell are performed.

Namely, the apparatus for processing exhaust fluid purifies process by-products, such as non-reactive or waste gases, ejected from the process chamber 10 and ejects the process by-products to the outside. In order to this, the apparatus for processing exhaust fluid includes a vacuum pump 100 and an auxiliary pump 300 which are connected through the connection pipe 20 to the process chamber 10, and a plasma reactor 200 that is connected to the vacuum pump 100 and the auxiliary pump 300 and removes process by-products such as non-reactive or waste gases included in the gases ejected from the process chamber 10.

The plasma reactor 200 is provided in front of the vacuum pump 100 so that a low-pressure vacuum state is maintained inside the plasma reactor 200. The vacuum state is maintained in a low pressure state that is the same as that of the process chamber 10 according to the installed position of the plasma reactor 200.

A reactive gas injection unit (not shown) is disposed on a pipe that connects the plasma reactor 200 and the auxiliary pump 300, and a scrubber 400 that purifies the gas ejected from the vacuum pump 100 is provided behind the vacuum pump 100.

The vacuum pump 100 connects to the process chamber 10, and is adapted to vacuumize the inside of the process chamber 10 and ejects the process by-products generated in the process chamber 10. The apparatus for processing exhaust fluid may further include the auxiliary pump 300 to smoothly eject the process by-products generated in the process chamber 10. In this case, the auxiliary pump 300 functions to increase the exhaust velocity of the vacuum pump 100.

The auxiliary pump 300 is provided between the process chamber 10 and the plasma reactor 200 as shown in FIGS. 1 and 2 and is adapted to fundamentally prevent material generated in the plasma reactor 200 from moving back toward the process chamber 10 due to exhaust action of the auxiliary pump 300 that is disposed in front of the plasma reactor 200 to prevent a change in a pressure conditions which may occur in the plasma reaction process from affecting the pressure state inside of the process chamber 10.

The plasma reactor 200 generates low-pressure plasma therein, and decomposes the process by-products such as non-reactive or waste gases contained in fluid generated in and ejected from the process chamber 10 into constituent elements of the plasma with a high temperature.

The constituent elements combine with reactive gases injected through the reactive gas injection unit (not shown) to be changed into harmless material. Since the plasma includes many reactive materials such as electrons or excited atoms and has sufficient energy sufficient to cause a chemical reaction, the plasma accelerates the chemical reaction between the constituent elements and the reactive gases.

In order to prevent the material in the plasma reactor 200 from moving back toward the process chamber 10 and maintain a pressure state inside the process chamber 10 as described above, the plasma reactor 200 may be connected between the auxiliary pump 300 and the vacuum pump 100.

The scrubber 400 functions to purify the gas ejected from the vacuum pump 100 and is connected through an exhaust pipe 410 to the vacuum pump 100.

Figure 3:
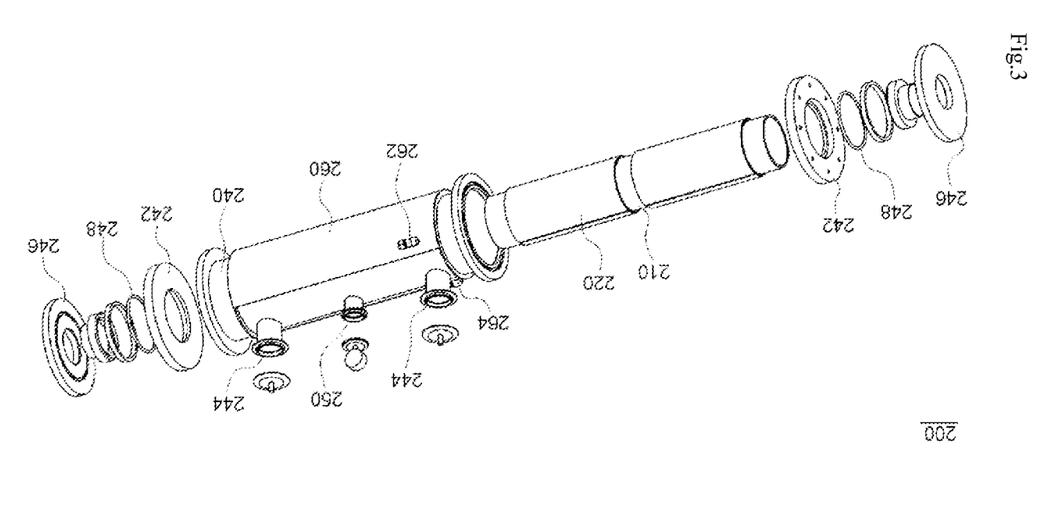
FIG. 3 is an exploded perspective view illustrating a plasma reactor according to an embodiment of the present invention.
Figure 4:
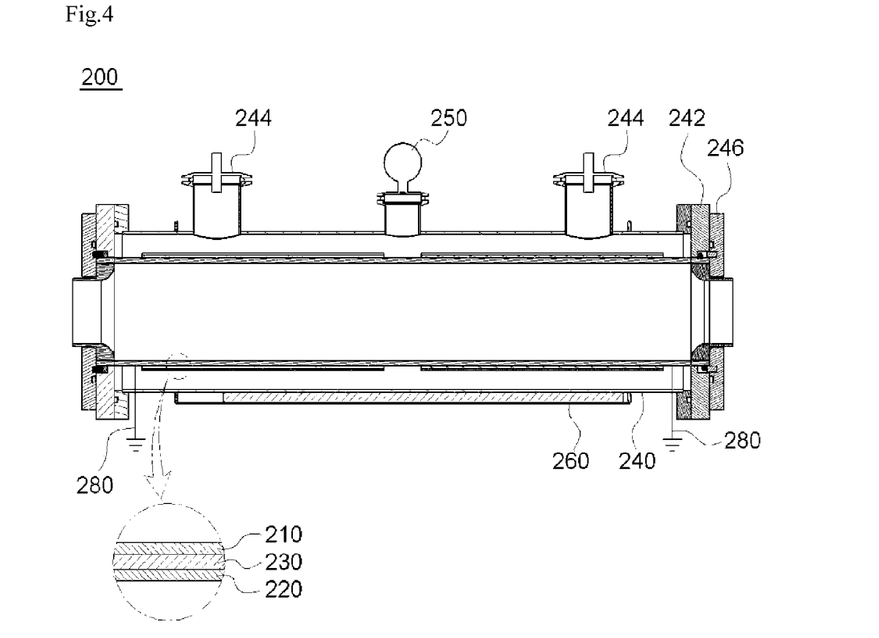
FIG. 4 is a side cross-sectional view illustrating the plasma reactor according to an embodiment of the present invention.

The detailed structure and the function of the plasma reactor 200 will now be explained. FIG. 3 is an exploded perspective view illustrating the plasma reactor 200 according to an embodiment of the present invention. FIG. 4 is a side cross-sectional view illustrating the plasma reactor 200 according to an embodiment of the present invention.

Referring to FIGS. 3 and 4, the plasma reactor 200 of the apparatus for processing exhaust fluid includes a conduit 210 that is provided between the process chamber 10 and the vacuum pump 100, at least one electrode unit 220 that is provided on an outer circumferential surface of the conduit 210, and a buffer unit 230 that is disposed between the conduit 210 and the electrode unit 220.

The conduit 210 has a cylindrical pipe shape in which both end portions are open. The conduit 210 provides a space in which process by-products such as non-reactive or waste gases contained in the fluid generated in and ejected from the process chamber 10 decompose as described above. The conduit 210 is composed of a dielectric substance formed of a high-k dielectric substance such as insulating ceramic or quartz.

Since the conduit 210 is formed to have a cylindrical pipe shape, the conduit 210 may be easily disposed on an existing pipe. Namely, even when the diameter of the conduit 210 and the diameter of the existing pipe are different from each other, the conduit 210 may be easily provided using a separate sealing member.

In detail, separate connection flanges 246 are provided on both end portions of the conduit 210 and connected to the existing pipe. The sealing members such as an O-ring are provided between the conduit 210 and the existing pipe to prevent fluid such as process by-products generated in the process chamber 10 from leaking out.

Also, since resistance against the movement of the fluid ejected from the process chamber 10 may be minimized, the maximum exhaust performance of the vacuum pump 100 may be maintained.

At least one electrode unit 220 is provided on the outer circumferential surface of the conduit 210. The electrode unit 220 receives voltage applied from a power supply unit 270 to discharge the plasma in the conduit 210. Namely, when the power supply unit 270 applies voltage to the electrode unit 220, plasma discharge occurs in the conduit 210 due to a voltage difference between the electrode unit 220 and a ground electrode 280.

Since the voltage applied to the electrode unit 220 is an alternating current (AC) voltage, the structure may be simpler and equipment costs may be less than those in the existing radio frequency (RF) driving method.

The electrode unit 220 is formed on the outer circumferential surface of the conduit 210 to have an annular shape having a predetermined length that surrounds a portion of the conduit 210 as shown in FIGS. 3 and 4. The electrode unit 220 is formed of metal material having high electrical conductivity such as copper.

Hence, since direct contact between the electrode unit 220 and process by-products such as non-reactive or waste gases moving in the conduit 210 is fundamentally blocked, the lifespan of the electrode unit 220 is extended.

Although two electrode units 220 are disposed at predetermined intervals on the outer circumferential surface of the conduit 210, the present embodiment does not limit the number of the electrode units 220. It will be understood that the number and lengths of the electrode units 220 may be adjusted according to the amount of energy applied to the conduit 210 for plasma discharge.

The conduit 210 is formed of insulating materials such as ceramic or quartz, and the electrode unit 220 is formed of metal materials such as copper or stainless steel. Since the materials have different physical properties and, in particular, have high elasticity and stiffness, it is difficult to attach the materials closely together.

As such, when a space is formed between the conduit 210 and the electrode unit 220, a parasitic drain such as current leakage occurs in the space, thereby reducing plasma discharge efficiency in the conduit 210.

Also, plasma discharge occurs at a high temperature of about 1,000° C. in the conduit 210, and the electrode unit 220 receives voltage from the power supply unit 270 to generate resistance heat. Since there is a difference in volume between the conduit 210 and the electrode unit 220 because the conduit 210 and the electrode unit 220 have different thermal expansion coefficients, contact efficiency between the conduit 210 and the electrode unit 220 is reduced, thereby reducing plasma discharge efficiency in the conduit 210.

Hence, according to the present embodiment of the present invention, the buffer unit 230 is disposed between the conduit 210 and the electrode unit 220 to improve the adhesive force between the conduit 210 and the electrode unit 220.

Since voltage has to be applied to the outer circumferential surface of the conduit 210 from the electrode unit 220 to generate plasma discharge in the conduit 210, the buffer unit 230 has to be formed of material having electrical conductivity. Since the buffer unit 230 has to be disposed between the conduit 210 and the electrode unit 220 to attach the conduit 210 and the electrode unit 220 closely together, the buffer unit 230 has to be formed of material having elasticity as well.

Namely, the buffer unit 230 may be formed of an elastic substance having high electrical conductivity such as conductive polymer material. Voltage may be applied to the outer circumferential surface of the conduit 210 from the electrode unit 220 via the buffer unit 230 that is electrically conductive, and the conduit 210 and the electrode unit 220 may be closely attached to each other due to the buffer unit 230 that has an elastic body.

Since the buffer unit 230 is disposed between the conduit 210 and the electrode unit 220, it is preferable that the buffer unit 230 has a diameter greater than that of the conduit 210 and less than that of the electrode unit 220. It is preferable that the buffer unit 230 has an annular shape that surrounds a portion of the conduit 210, like the electrode unit 220, and a length corresponding to the length of the electrode unit 220.

The plasma reactor 200 further includes an external pipe 240 into which the conduit 210, the electrode unit 220, and the buffer unit 230 are inserted. Since the conduit 210, the electrode unit 220, and the buffer unit 230 are disposed in the external pipe 240, the plasma reactor 200 has a dual pipe structure.

The conduit 210 that is formed of a high-k dielectric substance such as insulating ceramic or quartz has a high temperature of about 1000° C. in a vacuum state during plasma discharge, and thus the conduit 210 itself may crack or be damaged or a connecting portion between the conduit 210 and a peripheral pipe around the conduit 210 may crack.

Accordingly, since the plasma reactor 200 has a dual pipe structure in which the external pipe 240 is disposed outside the conduit 210, fluid such as process by-products may be prevented from leaking out when the conduit 210 cracks or is damaged as described above.

Since sealing flanges 242 are provided on both end portions of the conduit 210 and the external pipe 240, a space between the conduit 210 and the external pipe 240 may be sealed securely. Namely, the space between the conduit 210 and the external pipe 240 may be sealed by providing sealing members 248 such as O-rings on both end portions of the conduit 210 and the external pipe 240 and coupling the sealing flanges 242 to both of the end portions of the external pipe 240 as shown in FIG. 3.

A wiring hole 244 is formed on the outer circumferential surface of the external pipe 240. Wires are introduced through the wiring hole 244 to apply voltage to the power supply unit 270.

The plasma reactor 200 further includes a sensor unit 250 that is provided in the space between the conduit 210 and the external pipe 240. When the conduit 210 itself cracks or is damaged or the connecting portion between the conduit 210 and the peripheral pipe around the conduit 210 cracks due to high heat shock in the conduit 210 or accumulation of stress caused by various external and internal physical factors, the sensor unit 250 may detect fluid leaking out from the conduit 210 and may stop the operation of the plasma reactor 200.

The plasma reactor 200 further includes a cooling unit 260 that is provided on the outer circumferential surface of the external pipe 240. The cooling unit 260 is formed with a shape that surrounds the outer circumferential surface of the external pipe 240 to prevent overheating of the electrode unit 220.

Namely, the electrode unit 220 that is provided on the outer circumferential surface of the conduit 210 receives not only resistance heat generated by receiving a voltage from the power supply unit 270 but also high heat from the conduit 210 that generates plasma discharge at a high temperature therein. In order to prevent damage to the electrode unit 220 due to the heat, the cooling unit 260 is provided.

An inlet 262 and an outlet 264 are provided on one end portion of the cooling unit 260, and a cooling medium is introduced into or discharged from the cooling unit 260 through the inlet 262 or the outlet 264.

FIGS. 5 through 8 are diagrams schematically illustrating the apparatus for processing exhaust fluid of according to an embodiment of the present invention. An arrangement of the apparatus for processing exhaust fluid will be explained in detail with reference to FIGS. 5 through 8.

Figure 5:
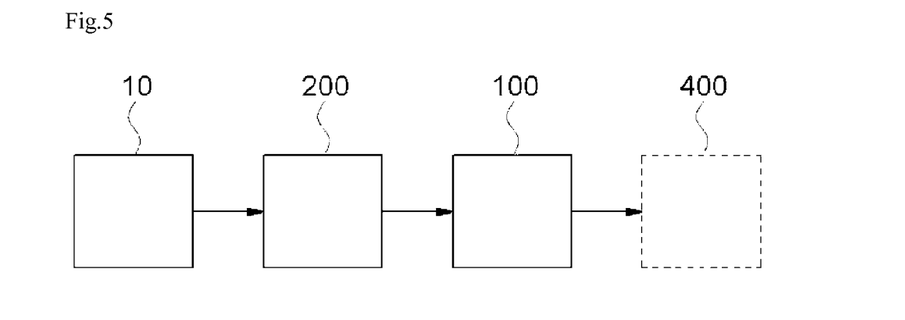
FIGS. 5 through 8 are diagrams schematically illustrating the apparatus for processing exhaust fluid according to an embodiment of the present invention.

In regards to FIG. 5, the plasma reactor 200 is provided between the process chamber 10 and the vacuum pump 100. Namely, since the plasma reactor 200 is provided in front of the vacuum pump 100, the plasma reactor 200 may efficiently decompose the process by-products ejected from the process chamber 10, thereby preventing energy waste. In particular, since the plasma reactor 200 may control the sizes of particles such as process by-products, when process by-products are process by-products of solid form, the plasma reactor 200 may further improve the mobility of process by-products of solid form introduced into the vacuum pump 100 to reduce the accumulation amount in the vacuum pump 100, thereby extending the lifespan of the vacuum pump 100.

Figure 6:
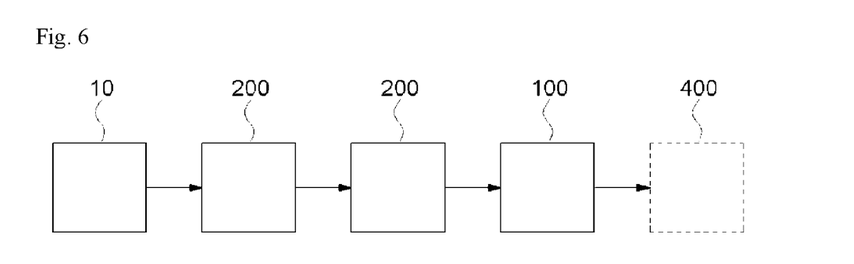
Figure 7:
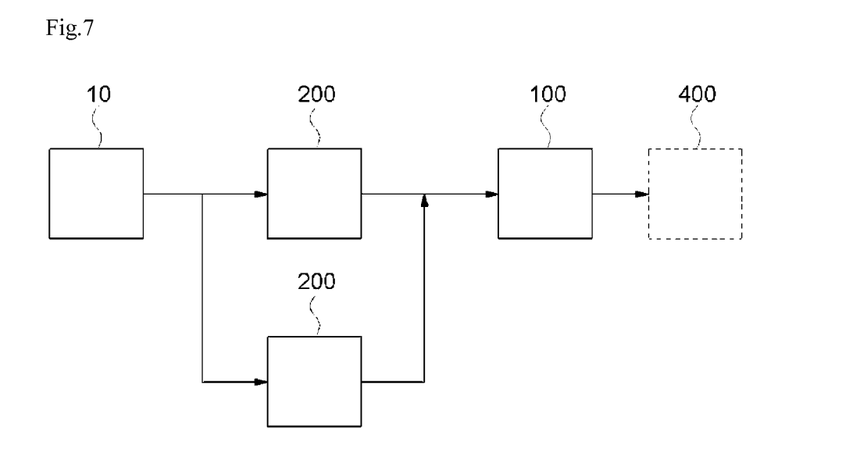

Referring to FIGS. 6 and 7, multiple plasma reactors 200 are provided between the process chamber 10 and the vacuum pump 100, in a series or in a parallel arrangement. That is, since two or more plasma reactors 200 are disposed in various ways according to a process in the inside of the process chamber 10, fluid such as process by-products may be appropriately purified according to the process environment.

In detail, when multiple plasma reactors 200 are connected between the process chamber 10 and the vacuum pump 100 in a series in parallel arrangement, voltages applied to the plasma reactors 200 may differ and a sequential purification process may be performed according to a change in the voltages. Namely, since a predetermined amount of process by-products may be processed in one plasma reactor 200 and other process by-products may be processed in another plasma reactor 200, an efficient purification process may be performed even when multiple process by-products are simultaneously introduced.

Also, a sequential purification process may be performed by injecting different reactive gases into the multiple plasma reactors 200. Namely, since a predetermined amount of process by-products may be processed in one plasma reactor 200 by reacting with one reactive gas and other process by-products may be processed in another plasma reactor 200 by reacting with other reactive gas, an efficient purification process may be performed according to the types of process by-products.

Figure 8:
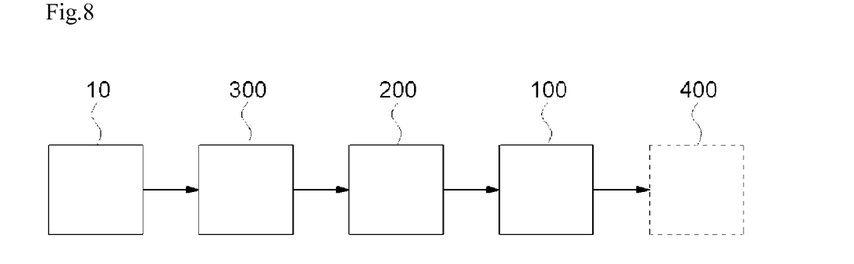

Referring to FIG. 8, the auxiliary pump 300 is provided in front of the plasma reactor 200 to increase the exhaust velocity of the vacuum pump 100. This is to fundamentally prevent material generated in the plasma reactor 200 from moving back toward the process chamber 10 due to the exhaust action of the auxiliary pump 300 that is disposed in front of the plasma reactor 200 and to prevent a change in pressure conditions which may occur in a plasma reaction process from affecting the pressure state in the process chamber 10 as described above.

Even when the auxiliary pump 300 is provided, multiple plasma reactors 200 are provided, and they are connected between the auxiliary pump 300 and the vacuum pump 100 in a series or in a parallel arrangement as shown in FIGS. 6 and 7. A function and an effect thereof have been described above and thus the explanation will not be repeated here.

The plasma reactor 200 of the apparatus for processing exhaust fluid may be effectively used to process not only process by-products in powder shape and a gas state such as non-reactive or waste gases but also a liquid precursor used in atomic layer deposition (ALD) among the process of manufacturing a semiconductor.

As described above, since an apparatus for processing exhaust fluid according to the present invention includes a plasma reactor having a pipe shape, the apparatus for processing exhaust fluid may be easily provided on an existing pipe. Since the apparatus for processing exhaust fluid minimizes resistance against the movement of exhaust fluid, the apparatus for processing exhaust fluid may improve the exhaust performance of a vacuum pump.

Also, since the plasma reactor has an electrode structure having an annular shape outside a conduit through which process by-products move to fundamentally block direct contact between the electrode and the process by-products, the plasma reactor may improve the durability of an electrode.

Also, since AC voltage is used to generate plasma, the structure is simpler and the equipment costs are less than those of the existing RF driving method.

It will be apparent to those skilled in the art that various modifications can be made to the above-described exemplary embodiments of the present invention without departing from the spirit or scope of the invention. Thus, the present invention is intended to cover all such modifications provided they come within the scope of the appended claims and their equivalents.

What is claimed is:

1. An apparatus for processing exhaust fluid in which a fluid generated in a process chamber of the apparatus for manufacturing a semiconductor, a display panel, or a solar cell is ejected to the outside, wherein the apparatus for processing exhaust fluid comprises:
   a vacuum pump that is connected to the process chamber, vacuumizes an inside of the process chamber, and ejects the fluid generated in the process chamber to the outside; and
   a plasma reactor in which plasma is formed and the fluid generated in the process chamber decomposes,
   wherein the plasma reactor comprises:
      an insulating conduit that is provided between the process chamber and the vacuum pump and provides a space in which the fluid decomposes;
      at least one electrode unit that is provided on an outer circumferential surface of the conduit, forms an annular shape of a predetermined length that surrounds the conduit and receives a voltage to form the plasma;
      a buffer unit that is formed of an electrically conductive elastic substance and is disposed between the conduit and the electrode unit to attach the conduit and the electrode unit closely together, and is formed on an inner surface of the electrode unit to have an annular shape that surrounds the conduit, and to have a length corresponding to a length of the electrode unit; and
      an external pipe into which the conduit, the electrode unit and the buffer unit are inserted, and sealing flanges that are provided on both end portions of the conduit, and the external pipe to seal a space between the conduit and the external pipe, and
   wherein the plasma reactor has a dual pipe structure in which the external pipe is disposed outside the conduit to prevent fluid process by-products from leaking out when the conduit cracks or is damaged.

2. The apparatus for processing exhaust fluid of claim 1, wherein the conduit is formed of an insulating ceramic or quartz.

3. The apparatus for processing exhaust fluid of claim 1, wherein the plasma reactor further comprises a sensor unit that is provided between the conduit and the external pipe to detect the fluid leaking out from the conduit.

4. The apparatus for processing exhaust fluid of claim 1, wherein the plasma reactor further comprises a cooling unit that is provided on an outer circumferential surface of the external pipe to prevent overheating of an electrode unit.

5. The apparatus for processing exhaust fluid of claim 1, wherein the plasma reactor further comprises a power supply unit that applies an alternating current (AC) voltage to the electrode unit.

6. The apparatus for processing exhaust fluid of claim 1, wherein multiple plasma reactors are provided and connected in a series or in parallel arrangement between the process chamber and the vacuum pump.

7. The apparatus for processing exhaust fluid of claim 1, further comprising an auxiliary pump that is provided between the process chamber and the plasma reactor to increase an exhaust velocity of the vacuum pump.

8. The apparatus for processing exhaust fluid of claim 7, wherein multiple plasma reactors are provided and connected in a series or in a parallel arrangement between the auxiliary pump and the vacuum pump.

* * * * *